United States Patent
Kaplo

(10) Patent No.: US 7,622,407 B2
(45) Date of Patent: *Nov. 24, 2009

(54) MULTIPLANAR EMI SHIELDING GASKET AND METHOD OF MAKING

(76) Inventor: Joseph J. Kaplo, 463 Exter Rd., Hampton, NH (US) 03842

( * ) Notice: Subject to any disclaimer, the term of this patent is extended or adjusted under 35 U.S.C. 154(b) by 0 days.

This patent is subject to a terminal disclaimer.

(21) Appl. No.: 11/307,370

(22) Filed: Feb. 3, 2006

(65) Prior Publication Data
US 2006/0199458 A1 Sep. 7, 2006

Related U.S. Application Data

(63) Continuation of application No. 10/419,464, filed on Apr. 21, 2003, now Pat. No. 7,022,405.

(51) Int. Cl.
*B32B 5/24* (2006.01)
*H05K 9/00* (2006.01)

(52) U.S. Cl. .................. 442/370; 442/414; 442/415; 442/361; 442/373; 428/316.6; 428/306.6; 428/308.4; 428/309.9; 174/350; 174/358

(58) Field of Classification Search ............ 428/316.6, 428/306.6, 308.4, 309.9, 319.1; 174/35 R, 174/35 GC, 350, 358; 442/373, 315, 370, 442/414, 415, 361
See application file for complete search history.

(56) References Cited

U.S. PATENT DOCUMENTS

| | | | |
|---|---|---|---|
| 4,857,668 A | 8/1989 | Buonanno | |
| 4,887,368 A * | 12/1989 | Latzke | 607/111 |
| 4,999,237 A * | 3/1991 | Mellors et al. | 442/67 |
| 5,319,867 A * | 6/1994 | Weber | 36/44 |
| 5,641,438 A | 6/1997 | Bunyan et al. | |
| 5,712,449 A | 1/1998 | Miska et al. | |
| 5,994,245 A * | 11/1999 | Marier et al. | 442/373 |
| 6,303,180 B1 | 10/2001 | Bunyan et al. | |
| 6,309,742 B1 | 10/2001 | Clupper et al. | |
| 6,395,402 B1 | 5/2002 | Lambert et al. | |
| 6,502,289 B1 * | 1/2003 | Kane et al. | 28/107 |
| 7,022,405 B2 * | 4/2006 | Kaplo | 428/316.6 |
| 7,081,292 B2 * | 7/2006 | Kaplo | 428/316.6 |

FOREIGN PATENT DOCUMENTS

| | | | |
|---|---|---|---|
| EP | 0 917 419 A1 | 5/1999 | |
| GB | 2137866 A | * 10/1984 | |
| GB | 2313383 A | * 11/1997 | |
| WO | WO 01/81799 A1 | 11/2001 | |

OTHER PUBLICATIONS

Laird New Product Bulletin, "Announcing Flame Retardant Conductive Foam," Laird Technologies, Jun. 2001.

* cited by examiner

*Primary Examiner*—Hai Vo
(74) *Attorney, Agent, or Firm*—Robert R. Deleault, Esq.; Mesmer & Deleault, PLLC

(57) ABSTRACT

A multiplanar, conductive gasket material having a foam core, a conductive web layer comprising a blended mixture of conductive fibers and nonconductive fibers, and a plurality of blended mixture fibers interspersed through the foam core. The blended mixture fibers are heat set within the gasket material.

11 Claims, 5 Drawing Sheets

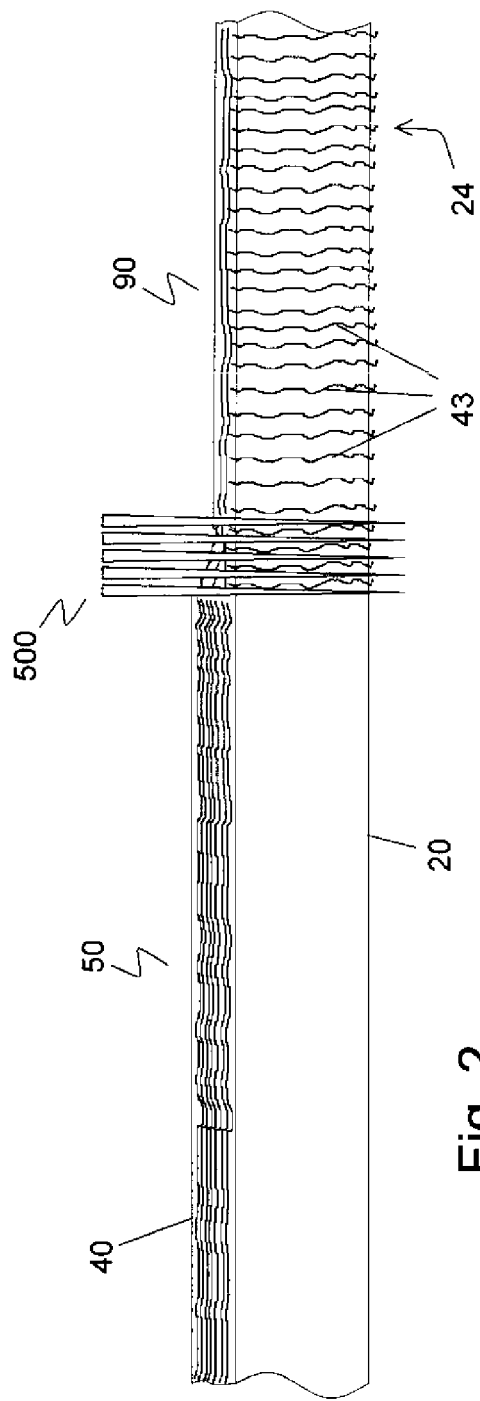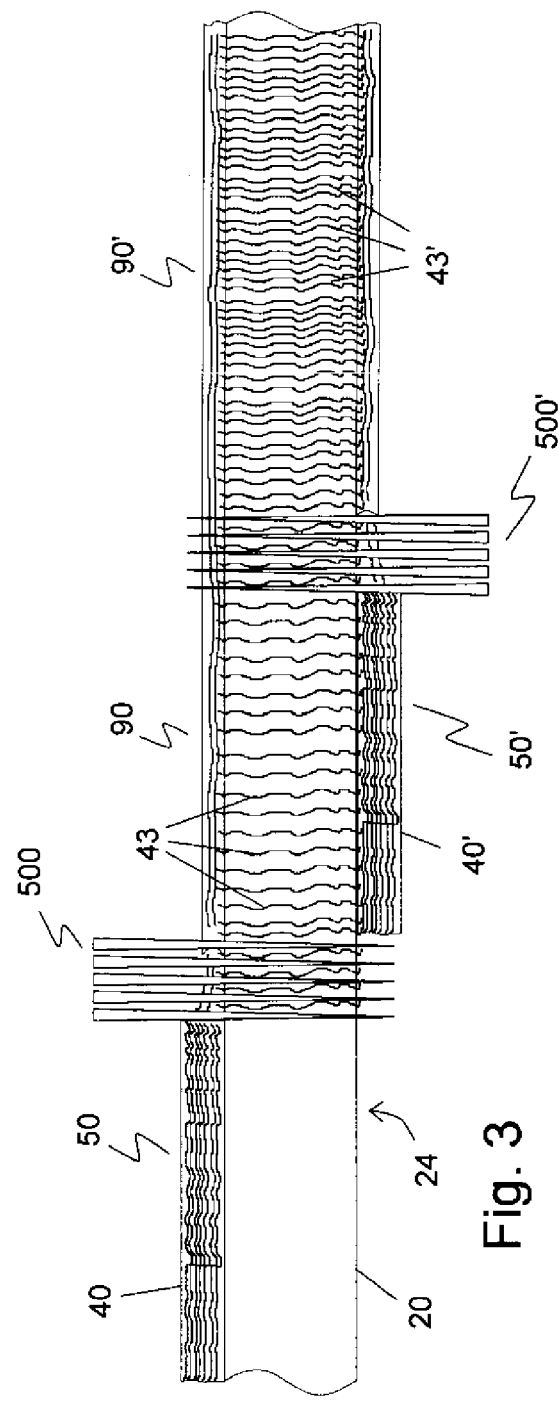

MULTIPLANAR EMI SHIELDING GASKET AND METHOD OF MAKING

This application is a Continuation application of Ser. No. 10/419,464, filed on Apr. 21, 2003.

BACKGROUND OF THE INVENTION

1. Field of the Invention

The present invention relates generally to an EMI shielding gasket. Particularly, the present invention relates to an EMI shielding gasket having electrical conductivity through the gasket.

2. Description of the Prior Art

EMI shielding gaskets are used to electrically seal gaps in metallic enclosures that encompass electronic components. The gaps between the panels, hatches, etc., and a housing provide an undesired opportunity for EMI/RFI to pass through the shield. The gaps also interfere with electrical currents running along the surfaces of the housing from EMI/RFI energy, which is absorbed and is being conducted to ground. The gaps reduce the efficiency of the ground conduction path and may even result in the shield becoming a secondary source of EMI/RFI leakage.

Various configurations of gaskets have been developed over the years to close the gaps to effect the least possible disturbance of the ground conduction currents. Each seeks to establish as continuous an electrically conductive path as possible across the gaps. Some are useful in only static applications while others may be used in both static and dynamic applications. A static application is one where parts function at a fixed height and where loading force is constant. A dynamic application is one where parts function under a varying height from maximum to minimum limits and where loading forces will vary inversely proportional to height. An example of a dynamic, application is one where plates, hatches, etc., are repeatedly separated and reconnected to a housing.

Enclosures that house various electronic components must oftentimes be opened and closed in order to service the electronic components inside. To withstand numerous enclosure openings and closings, an EMI shielding gasket must be suitable for dynamic applications. Unfortunately, there are inevitable compromises between the ability of a gasket to smoothly and thoroughly engage and conform to the surface of the housing adjacent the gaps, the conductive capacity of the gasket, the ease of mounting the gasket, the ability of the gasket to withstand abrasive wear and tear as well as repeated compression and relaxation, and the cost of manufacturing the gasket. Numerous prior art EMI shielding gaskets have been disclosed.

U.S. Pat. No. 6,309,742 B1 (2002, Clupper et al.) discloses an EMI/RFI shielding gasket. The electrically conductive gasket has a metallized, open-celled foam substrate with a skeletal structure and a metal coating deposited onto the skeletal structure. The gasket is both recoverable and substantially deformable under low pressure. The metallization of the foam is in the form of metallic coating on the skeletal structure of the foam. The metallic coating is deposited on the majority of surfaces throughout the open-celled foam substrate on the skeletal structure. A disadvantage of the Clupper device is that the metallization process must be carefully controlled in order to sufficiently coat the gasket with metal throughout the foam substrate to provide proper through-conductivity, yet not overly coat with metal such that the metallized foam becomes difficult to compress and/or insufficiently resilient.

U.S. Pat. No. 6,395,402 B1, (2002, Lambert et al.) discloses methods of preparing an electrically conductive polymeric foam. The methods include the steps of (a) contacting the polymeric foam with a surfactant solution; (b) contacting the polymeric foam with a sensitizing solution; (c) contacting the polymeric foam with an activation solution; and (d) forming at least one metallic layer on the polymeric foam with an electroless plating process.

A Laird Technologies new product bulletin discloses a flame retardant conductive foam that provides x, y and z-axis conductivity to enhance the shielding effectiveness. A disadvantage of the Laird conductive foam is that it is designed for non-dynamic, low stress areas such as input/output shielding as well as other standard connector configurations.

U.S. Pat. No. 6,465,731 (2002, Stanley Miska) discloses a through conductive EMI shielding. The Miska device uses a conductive core having either metal-plated fibers embedded into the core or a metal-plated foam core. A disadvantage of this device is that the metal-plated coating can break with repeated compression and relaxation causing a degradation in the through conductivity of the gasket.

The metallic-plated conductive foams of the above disclosures are not re-usable in dynamic applications because the plated metal surfaces that have been laid within the cells of the foam are rigid. These rigid metal surfaces will break down after initial compression has occurred.

Therefore, what is needed is an EMI shielding gasket material that is pliable and non-deformable for use in dynamic applications. What is further needed is an EMI shielding gasket material that provides conductance throughout a foam core yet does not have a rigid metallic-coated composition. What is still further needed is an EMI shielding gasket material that provides conductance throughout the X, Y, and Z-axes. What is still further needed is a method of making an EMI shielding gasket that is inexpensive and retains the foam core's resilient and compliant characteristics.

SUMMARY OF THE INVENTION

It is an object of the present invention to provide an EMI shielding gasket useful in dynamic applications. It is a further object of the present invention to provide an EMI shielding gasket that retains a relatively high conductance during the compression and relaxation cycles of re-use. It is yet a further object of the present invention to provide substantially similar shielding effectiveness with re-use. It is another object of the present invention to provide an EMI shielding gasket that shields in the three-dimensional X, Y, and Z-axes. It is still a further object of the present invention to provide a method of making an EMI shielding gasket that is inexpensive and retains the foam core's resilient and compliant characteristics.

The present invention achieves these and other objectives by providing a multiplanar EMI shielding gasket that has a flexible foam core, a conductive fiber web on at least one side of the foam core, and a plurality of blended conductive fibers interwoven throughout the foam core. The plurality of blended conductive fibers extends from the top surface of the foam core, through the interior of the foam core, and protrudes outward from the bottom surface of the foam core. The EMI shielding gasket exhibits X, Y, and Z axis conductivity due to the presence of the blended conductive fibers above, below, and throughout the foam core, respectively.

The foam core of the multiplanar EMI shielding gasket is composed of a conventional polymeric flexible cellular foam. The foam core may be open-celled, partially open-celled, or close-celled, depending upon the needs of the specific application. Conventional polymeric flexible cellular foams include but are not limited to thermoplastic elastomer (TPE) such as SANTOPRENE®, NEOPRENE® or a polyurethane-containing material such as polyester, polyether, polyurethane, or combinations thereof. The foams preferably have a thickness ranging from about 0.5 to about 50 millimeters.

The conductive fiber web of the multiplanar EMI shielding gasket is composed of a homogenously blended mixture of a plurality of conductive and nonconductive fibers. The conductive fibers of the fiber web are typically composed of silver, silver/copper, or silver/nickel on a nylon staple fiber of 1 to 15 Denier in size and 1 to 5 inches in length. The non-conductive fibers of the fiber web are typically composed of bi-component polyester fibers of 1 to 15 Denier in size and 1 to 5 inches in length. The conductive and non-conductive fibers of the present invention are blended in a typical ratio of 75/25, with this ratio adjustable upward or downward, depending upon the conductivity and shielding effectiveness (SE) of the desired end product.

The conductive fiber web is formed by blending the conductive and non-conductive fibers into a homogeneous mix and then feeding the blended fibers into a textile carding machine or a randomizing fiber webber. This process produces a 40 to 80 inch wide web with a weight between 10 to 200 grams per square yard, depending on the desired conductivity and shielding effectiveness of the finished product.

A stiffening fabric may optionally be added between the foam core and the conductive fiber web to create a stiffer final EMI gasket material. The stiffening fabric may be necessary when the foam core has a thickness of less than 5 millimeters. The stiffening fabric may be used where a finished strip of gasket product having a core thickness of less than five millimeters lacks a certain needed firmness, stiffness or rigidity.

In order to enhance both the conductivity and shielding effectiveness of the conductive gasket of the present invention, a thin layer of aluminum foil is inserted between the conductive fiber web and the flexible polyurethane foam core prior to the needlepunching operation. The aluminum foil layer has a thickness preferably between 0.0005 to 0.002 inches and is available from Neptco, Inc., Pawtucket, R.I. Addition of a thin aluminum foil layer improves the EMI gasket strip or die cut Input/Output gasket shielding performance.

In order to improve the ability of the strip gasket to stand up to repeated cross direction shear action, the entire back surface of the strip gasket or Input/Output gasket is covered with a special honeycomb-pattern, pressure sensitive adhesive. The special honeycomb pattern has diamond shaped apertures that allow for connectivity between the conductive back side of the multiplanar gasket and the surface upon which it is attached. This technique allows for the use of a non-conductive, less expensive PSA adhesive product such as that available as product number RX650ULT from Scapa North America, Windsor, Conn. The entire gasket or I/O surface is adhered solidly to the cabinet box or enclosure door providing superior cross shear action.

The multiplanar EMI shielding gasket material is formed by depositing the conductive fiber web onto the polymeric, flexible, cellular foam. The assembly of the conductive fiber web and the polymeric foam is then presented to a needlepunch loom. The loom needlepunches the blended fibers of the conductive fiber web through the foam. To avoid tearing up the foam, a special chisel pointed needle is used. The loom needle has a chisel point with a plurality of angled barbs along the needle shaft from the chisel point for a predefined distance. The barbs typically have a five-degree angle but loom needles having larger angled barbs may also be used. The larger the barb angle, the greater the number of fibers from the conductive fiber web carried through the foam.

Because the needlepunching process on the needlepunch loom tends to create a "carpet pile" like characteristic to the conductive fiber web, the intermediate product is heat-set to lock the fibers into place. The heat-setting process involves heating the intermediate product to the softening point of the bi-component polyester fibers, which is lower than the softening point of the conductive fibers. The softening point of the nonconductive, Bi-component polyester fibers is typically 240 to 280 degrees Fahrenheit.

The construction of the present invention provides flexibility and corner-ability that is unmatched by conventional products. It is the absence of a stiff, metallized woven fabric as well as the absence of layers of coatings or adhesives used to adhere the foam to the conductive fabric that allows the present invention to closely contact the electronic enclosure in order to give as close to perfect an EMI seal as possible; a critical characteristic needed for future high clock speeds with ultra-fine electric wave amplitude.

Further, the simplicity of manufacturing and the lower cost of the raw materials used provides important savings in the cost of the finished product. In addition, the simplified manufacturing process provides a user with a much wider or broader range of applications.

BRIEF DESCRIPTION OF THE DRAWINGS

FIG. 2 is a cross-sectional view of one embodiment of the present invention showing a partially formed sheet of EMI gasket material.

FIG. 3 is a cross-sectional view of a second embodiment of the present invention showing a partially formed sheet of EMI gasket material.

DETAILED DESCRIPTION OF THE PREFERRED EMBODIMENT

Figure 1:
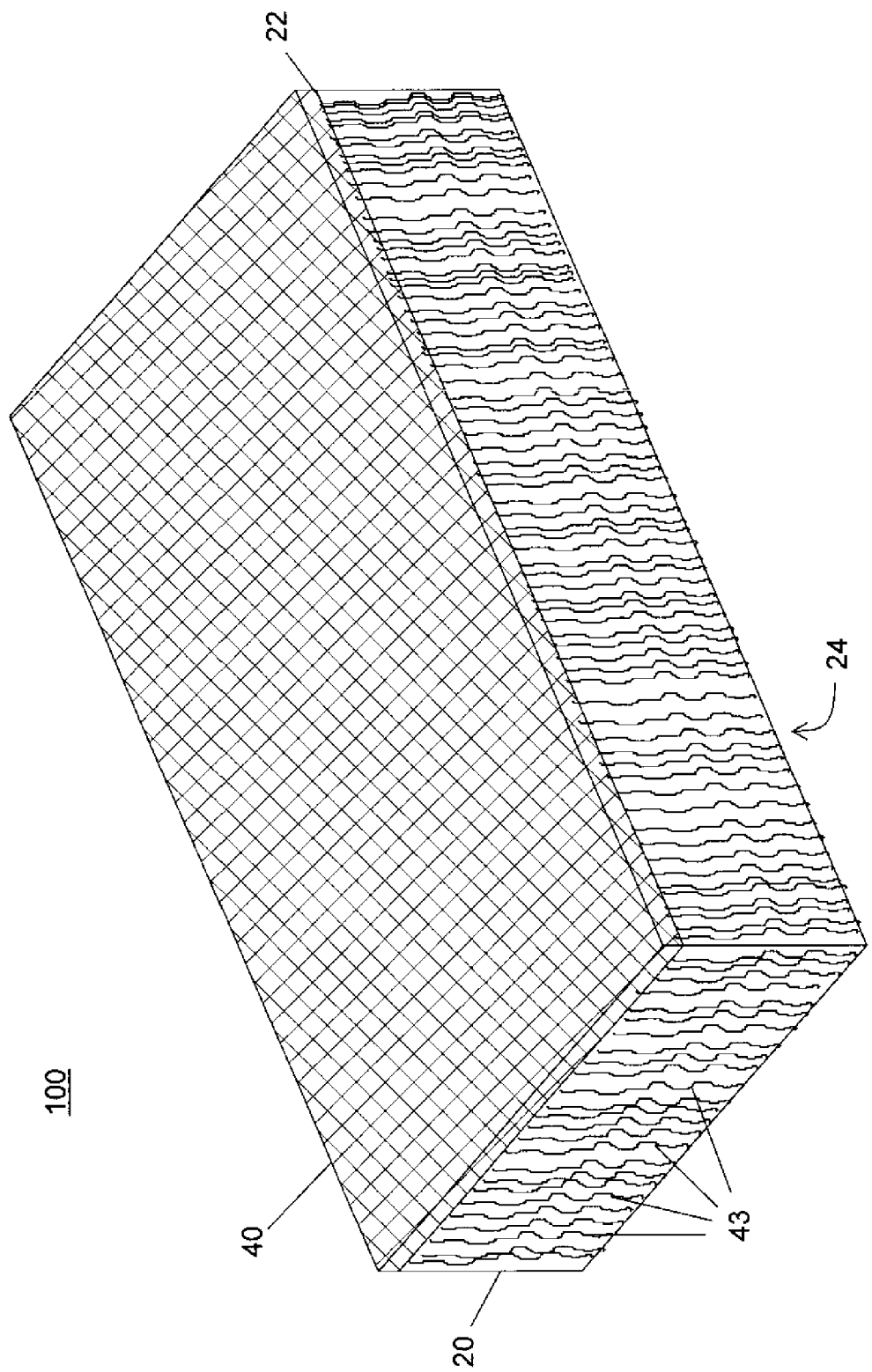
FIG. 1 is an enlarged, perspective view of the present invention showing the multiplanar EMI gasket material.

The preferred embodiments of the present invention are illustrated in FIGS. 1-7. FIG. 1 is a perspective view of a sheet of multiplanar EMI gasket material 100. Multiplanar EMI gasket material 100 has a polymeric foam core 20, a layer of a conductive fiber web 40 on at least one side of foam core 20, and a plurality of conductive fibers 43 interspersed entirely through foam core 20. Polymeric foam core 20 has a top surface 22 and a bottom surface 24 with a plurality of interspersed pores (not shown) located throughout foam core 20. The plurality of interspersed fibers 43 protrude from the bottom surface 24 of foam core 20 and maintain electrical continuity with conductive fiber web 40. An example of an acceptable material for use as foam core 20 is Foamex Ether foam type YCC240-115 available from Foamex International, East Rutherford, N.J.

Conductive fiber web 40 is a blended mixture of a plurality of conductive and nonconductive fibers. The conductive fibers and the nonconductive fibers are blended into a homogeneous mix and fed into a textile carding machine or a randomizing fiber webber. The process produces a forty to eighty inch wide web with a weight between about 10 to about 200 grams per square yard. The weight of the web depends on the conductivity and shielding effectiveness desired.

The conductive fibers are typically composed of silver, silver/copper, or silver/nickel on nylon staple fibers of one to fifteen Denier in size and one to five inches in length. The nonconductive fibers are nonconductive, Bi-component Polyester fibers available from Stein Limited, Albany, N.Y. A typical blend ratio of the conductive and nonconductive fibers is about 3 to 1 (75/25). The blend ratio, however, may be adjusted depending on the conductivity and shielding effectiveness requirements of the end product.

FIG. 2 is a cross-sectional view of the needleloom process of making one embodiment of EMI gasket material 100. Conductive fiber web 40 is brought into a layered relationship with foam core 20 forming a multiplanar assembly 50. Multiplanar assembly 50 is then subjected to a needleloom 500 that processes the multiplanar assembly 50 much like the process used for making carpets. Needleloom 500 intersperses individual fibers 43 of web 40 from web 40 through foam core 20 so that a plurality of individual fibers 43 protrude out of bottom surface 24. The needleloom process interlocks, or binds, fiber web 40 to foam core 20 forming multiplanar core 90 without the need of an adhesive.

Turning now to FIG. 3, there is illustrated a cross-sectional view of the needleloom process making a second embodiment of EMI gasket material 100. As described above, conductive fiber web 40 is brought into a layered relationship with foam core 20 forming a multiplanar assembly 50. Multiplanar assembly 50 is then subjected to a needleloom 500 that processes the multiplanar assembly 50. Needleloom 500 intersperses individual fibers 43 of web 40 from web 40 through foam core 20 so that a plurality of individual fibers 43 protrude out of bottom surface 24. The needleloom process interlocks, or binds, fiber web 40 to foam core 20 forming multiplanar core 90. A second conductive fiber web 40' is then brought into a layered relationship with foam core 20 at bottom surface 24 forming a multiplanar assembly 50' composed of multiplanar core 90 and second conductive fiber web 40'. Multiplanar assembly 50' is then subjected to a second needleloom 500' that processes the multiplanar assembly 50'. Needleloom 500' intersperses individual fibers 43' of web 40' through foam core 20 so that a plurality of individual fibers 43' protrude and make contact with conductive web 40. The second needleloom process interlocks fiber web 40' to multiplanar core 90 forming multiplanar core 90'.

Figure 4:
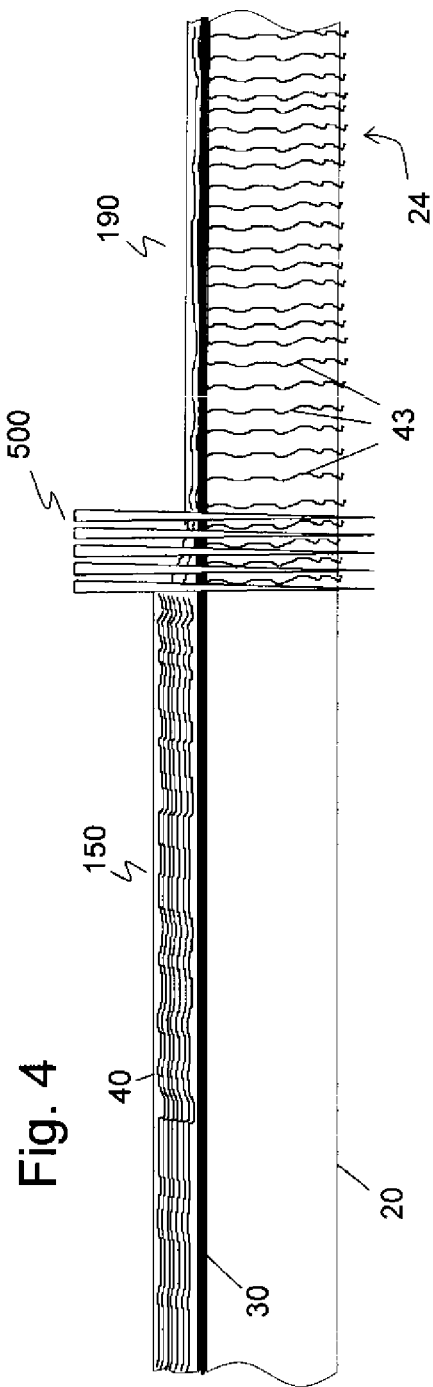
FIG. 4 is a cross-sectional view of a third embodiment of the present invention showing a partially formed sheet of EMI gasket material having a stiffening fabric added between the foam core and the conductive fiber web.

In instances where the thickness of foam core 20 is too thin such as, for example, less than five millimeters in thickness, the gasket material 100 may lack a certain needed firmness, stiffness or rigidity. FIG. 4 is a cross-sectional view of the needleloom process making a third embodiment of EMI gasket material 100. A non-conductive, stiffening fabric 30 is brought into a layered relationship between conductive fiber web 40 and foam core 20 forming a multiplanar assembly 150. Multiplanar assembly 150 is then subjected to a needleloom 500 that processes the multiplanar assembly 150. Needleloom 500 intersperses individual fibers 43 of web 40 from web 40 through stiffening fabric 30 and foam core 20 so that a plurality of individual fibers 43 protrude out of bottom surface 24. The needleloom process interlocks, or binds, fiber web 40 to stiffening fabric 30 and foam core 20 forming multiplanar core 190.

Figure 5:
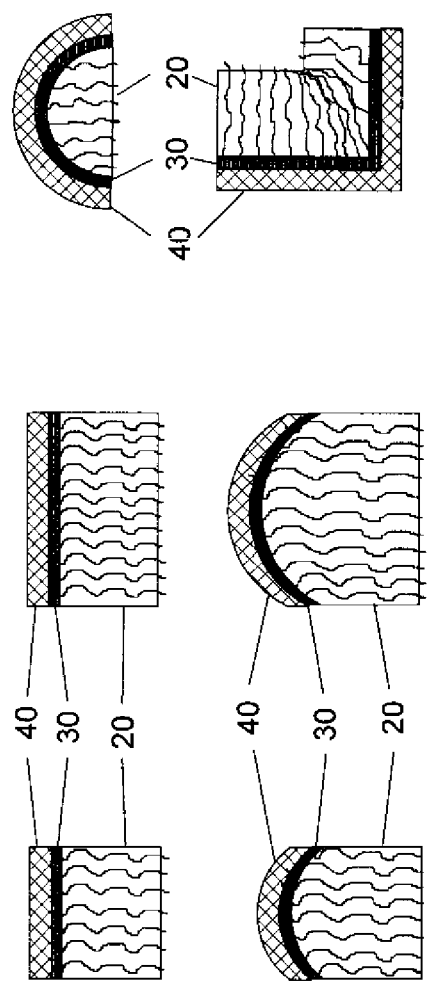
FIG. 5 is a cross-sectional view of a variety of thermoformed shapes using the gasket material of the present invention.
Figure 6:
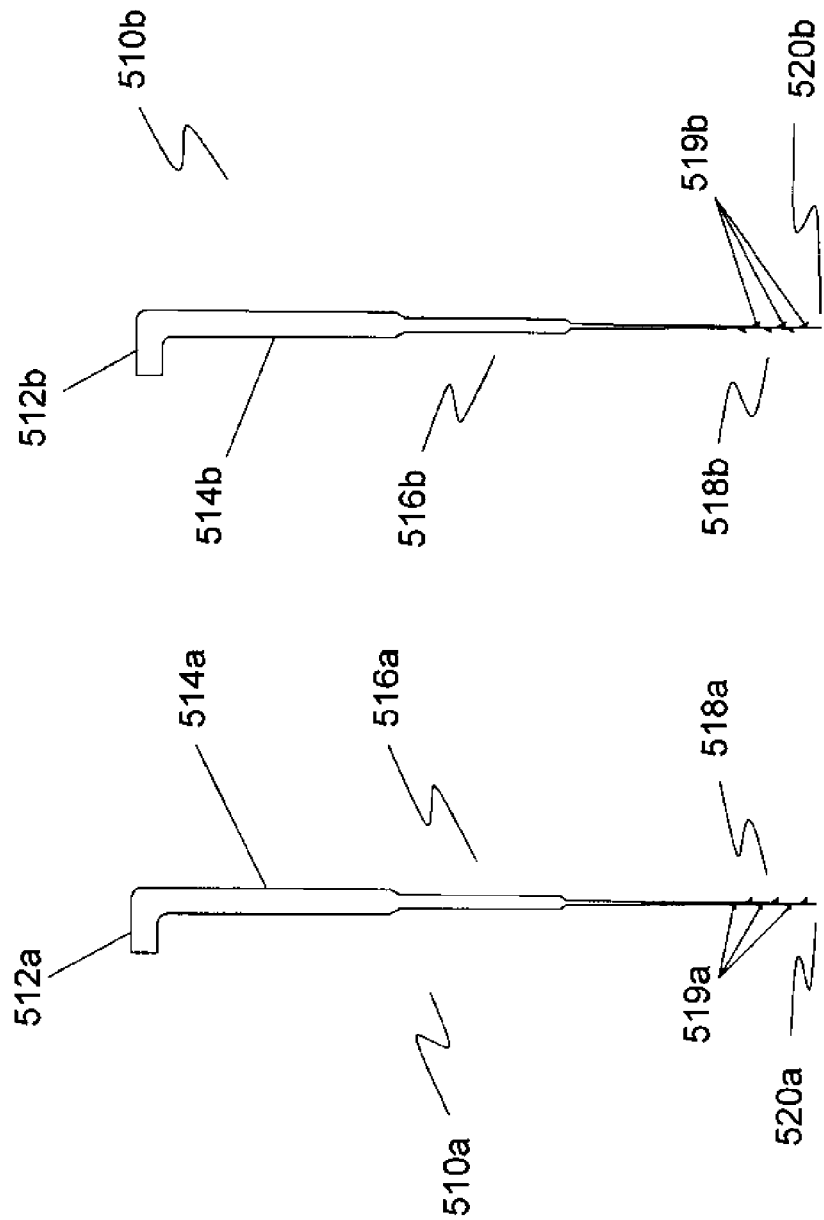
FIGS. 6A and 6B are side views of needles used in the needlelooming process of forming the multiplanar EMI gasket material of the present invention.

Stiffening fabric 30 is preferably a web of nonconductive fibers having a blend of about 4 to 1 (80/20) of Bi-component polyester and regular polyester fibers, respectively. Bi-component polyester typically has a softening point of about 240° F. to 280° F. An added advantage of incorporating stiffening fabric 30 is to utilize the stiffening fabric's thermoforming characteristics in various three-dimensional cross-sections that provide better shielding strip and input/output gaskets. FIG. 5 provides illustrative examples of various shapes, but should not be construed as limited to only those illustrated shapes. Each of the shapes include a foam core 20, a stiffener fabric 30, a conductive fiber web 40, and a plurality of conductive fibers 43 penetrating through foam core 30, all as previously disclosed.

To enhance both the conductivity and shielding effectiveness of gasket material 100, an aluminum foil layer may be inserted between conductive fiber web 40 and foam core 20. FIG. 4 may be used to illustrate the enhanced gasket material 100 as the stiffening fabric 30 is simply replaced by the aluminum foil layer. The remaining needlepunching operation is the same. It is noted that a combination of a stiffening fabric 30 and an aluminum foil layer may also be used. In such a case, the aluminum foil layer will preferably be adjacent the stiffening fabric 30.

FIGS. 6A and 6B are side views of two illustrative examples of needles used in needleloom 500. FIGS. 6A and 6B illustrate needlepunch needles 510a and 510b. Needles 510a and 510b have identical crank portions 512a, 512b, shank portions 514a, 514b, taper portions 516a, 516b, barb portions 518a, 518b, and chisel point portions 520a and 520b. Barb portion 518a of needle 510a has a plurality of five degree angled barbs 519a. Barb portion 518b of needle 510b has a plurality of twenty degree angled barbs 519b. The greater the degree angle on the barbs, the greater the number of fibers 43 carried by the needle through foam core 20. Needles 510a, 510b can be purchased from Foster Needles Company and are type 15×18×40×3 CBA F56-3B/CP special 6 barb needles. Particularly important features of needles 510a, 510b are that the needles (a) permit penetration of a cross-section of the foam without tearing it, and (b) carry the individual fibers 43 through the foam core 20 to the opposite side.

Another important feature of the present invention is the use of a fiber blend of conductive fibers and nonconductive, lower melting point fibers. The nonconductive, lower melting point fibers are Bi-component polyester (as previously disclosed) and have a softening point of about 240° F. to 280° F. Although the multiplanar cores 90 and 90' have the necessary qualities of a conductive gasket material, the fibers in the multiplanar cores 90 and 90' tend to create conductive fiber lint. This conductive fiber lint is unwanted, particularly in electronic applications where loose conductive fibers may cause unintended shorting in the electronic circuits. To prevent this from occurring, the multiplanar cores 90 and 90' are subjected to a heat treatment process.

Figure 7:
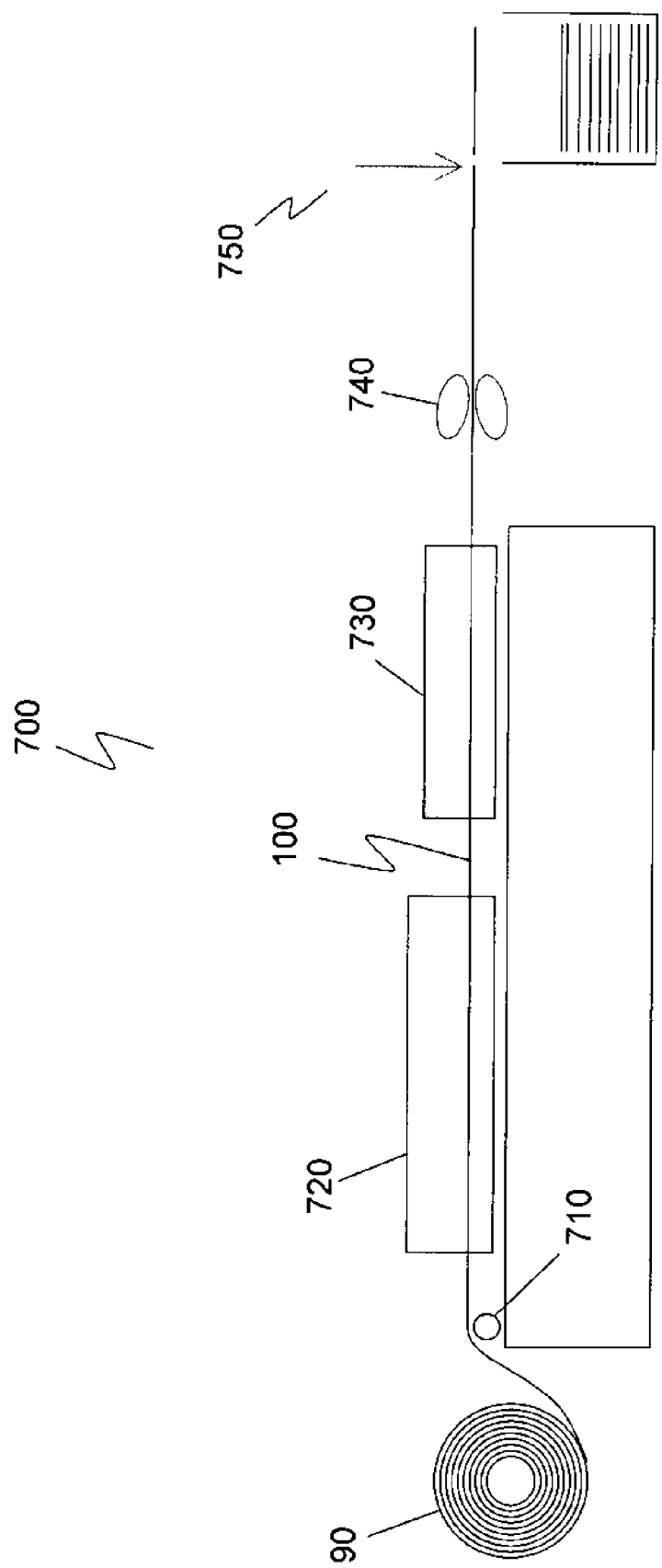
FIG. 7 is a side view of a thermoforming line to create the final multiplanar EMI gasket material of the present invention.

Turning now to FIG. 7 there is shown an illustrative example of such a heat treatment process. Thermoforming process 700 includes a roll of multiplanar core 90 or 90', a heated chamber 720, a cold shaping die 730, puller belts 740, and a cutting mechanism 750. Multiplanar core 90 or 90' is unrolled and fed over a roller 710 into heated chamber 720. Heated chamber 720 includes heated rollers such as a textile calendar or two heated belts that brings the multiplanar core 90 or 90' to the softening point of the nonconductive, Bi-component polyester fibers, which is typically about 240° F. to 280° F. This heating process locks the conductive fibers in place and avoids any subsequent movement or loss of conductive fibers while maintaining the gasket's resilient and compliant characteristics. The resultant material forms a multiplanar EMI gasket material that is conductive not only in the X and Y axis but also in the Z axis through the gasket.

At this point, the gasket material 100 may be stored for later die cutting or may be die cut after passing through heated chamber 720. If die cutting is performed as part of the thermoforming process 700, then the gasket material 100 is cooled to about ambient temperature before passing through cold shaping die 730. Cold shaping die 730 stamps or cuts the required template into gasket material 100, is passed through puller belts 740 and moved to the cutting mechanism 750 where the die-cut gaskets are cut to length.

The present invention and method provides a continuous sheath of flexible cellular foam having the ability to conduct electricity and to provide EMI shielding in a 3-axis (X-Y-Z) configuration. The present invention is the basic conductive gasket material for the manufacture of strip gaskets in very small and very wide widths as well as die cut Input/Output gaskets for very small and very large surface areas. It should be understood that the composite of conductive fibers needlepunched through the foam may be made in a variety of fiber densities and foam thickness that vary depending on the application. The conductive gasket material of the present invention may also be slit into individual strips for making continuous strip gaskets. Further, as explained above, using a layer of stiffening fabric made of the Bi-component polyester provides the ability to create a variety of thermomolded gasket shapes.

Although the preferred embodiments of the present invention have been described herein, the above description is merely illustrative. Further modification of the invention herein disclosed will occur to those skilled in the respective arts and all such modifications are deemed to be within the scope of the invention as defined by the appended claims.

What is claimed is:

1. An electrically conductive gasket material comprising:
   a foam core;
   a quantity of a blended mixture of a plurality of electrically conductive fibers and bi-component polyester nonconductive fibers wherein said plurality of electrically conductive fibers are present in an amount of about 50 wt % or greater in said quantity of said blended mixture, said plurality of electrically conductive fibers and nonconductive fibers extending in a nonrandom orientation completely through said foam core; and
   at least one electrically conductive web layer disposed on one side of said foam core wherein said electrically conductive web layer has a plurality of electrically conductive fibers and a plurality of nonconductive fibers wherein said electrically conductive fibers are present in an amount of about 50 wt % or greater of said electrically conductive web layer and wherein said plurality of electrically conductive fibers of said web layer are electrically coupled to said plurality of electrically conductive fibers of said blended mixture extending through said foam core.

2. The conductive gasket material of claim 1 further comprising a nonconductive stiffener fabric disposed between said at least one electrically conductive web layer and said foam core wherein said stiffener fabric is a web of electrically nonconductive fibers having a blend of bi-component polyester and regular polyester fibers in a blend ratio wherein the bi-component polyester is the major component of said blend.

3. The conductive gasket material of claim 2 wherein said plurality of electrically conductive and nonconductive fibers is locked into position by said plurality of nonconductive fibers.

4. The conductive gasket material of claim 2 wherein said stiffener fabric has a blend ratio of about 4 to 1 of bi-component polyester to regular polyester fibers.

5. The conductive gasket material of claim 1 further comprising a second electrically conductive web layer comprising a plurality of electrically conductive fibers and a plurality of nonconductive fibers wherein said electrically conductive fibers are present in an amount of about 50 wt % or greater of said second electrically conductive web layer, said second electrically conductive web layer being disposed on a second side of said foam core.

6. The conductive gasket material of claim 5 wherein a plurality of said electrically conductive fibers of said second electrically conductive web layer extends in a nonrandom orientation through said foam core.

7. The conductive gasket material of claim 1 wherein said plurality of electrically conductive fibers of said blended mixture of said plurality of electrically conductive and nonconductive fibers is locked into position by said plurality of nonconductive fibers.

8. The conductive gasket material of claim 1 wherein said plurality of electrically conductive fibers of said at least one electrically conductive web layer are present in an amount in a range of about 50 wt % to about 75 wt % of said web layer.

9. The conductive gasket material of claim 1 wherein said plurality of nonconductive fibers are made of a bi-component polyester having a softening point of about 240° C. to about 280° C.

10. The conductive gasket material of claim 1 further comprising an aluminum foil layer disposed between said at least one electrically conductive web layer and said foam core.

11. The conductive gasket material of claim 1 wherein said plurality of electrically conductive fibers of said blended mixture are present in an amount in a range of about 50 wt % to about 75 wt % of said quantity of said blended mixture.

* * * * *